(12) United States Patent
Kartaeusch et al.

(10) Patent No.: US 11,035,918 B2
(45) Date of Patent: Jun. 15, 2021

(54) METHOD AND APPARATUS FOR REDUCING ARTIFACTS IN A MAGNETIC RESONANCE IMAGE DATASET

(71) Applicant: Siemens Healthcare GmbH, Erlangen (DE)

(72) Inventors: Ralf Kartaeusch, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 118 days.

(21) Appl. No.: 16/195,151

(22) Filed: Nov. 19, 2018

(65) Prior Publication Data

US 2019/0154782 A1    May 23, 2019

(30) Foreign Application Priority Data

Nov. 20, 2017 (DE) .......................... 102017220699.3

(51) Int. Cl.
*G01R 33/56* (2006.01)
*G01R 33/565* (2006.01)
*G01R 33/48* (2006.01)

(52) U.S. Cl.
CPC ..... *G01R 33/5608* (2013.01); *G01R 33/4824* (2013.01); *G01R 33/56545* (2013.01); *G01R 33/56563* (2013.01); *G01R 33/56572* (2013.01)

(58) Field of Classification Search
CPC ............ G01R 33/4824; G01R 33/4826; G01R 33/5608; G01R 33/56545; G01R 33/56563; G01R 33/56572; G01R 33/243; G01R 33/246; G01R 33/443

USPC .................................................. 324/300–322
See application file for complete search history.

(56) References Cited

U.S. PATENT DOCUMENTS

| 7,348,776 B1 * | 3/2008 | Aksoy | G01R 33/5611 324/307 |
| 7,941,204 B1 * | 5/2011 | Wang | G01R 33/5614 600/420 |
| 8,427,153 B2 * | 4/2013 | Hu | G01R 33/3415 324/309 |

(Continued)

OTHER PUBLICATIONS

Kholmovski et al: "Streak Artifact Suppression in Multi-coil MRI with Radial Sampling," In: Proc. Intl. Soc. Mag. Reson. Med. 15; 2007; Utah Center for Advanced Imaging Research; Department of Radiology; University of Utah; Salt Lake City; Utah; United States.

(Continued)

*Primary Examiner* — Dixomara Vargas
*Assistant Examiner* — Sean Curtis
(74) *Attorney, Agent, or Firm* — Schiff Hardin LLP

(57) ABSTRACT

In a method and magnetic resonance (MR) apparatus for reducing artifacts in an image dataset reconstructed from MR raw data that were acquired by radial sampling using different coil elements, for each of at least some of the coil elements, exclusion information is determined that identify MR data from that coil element that are responsible for at least one artifact, by a comparison of a sensitivity map, which defines a spatial reception capability of that coil element, with at least one comparison dataset obtained from at least a portion of the MR data from that coil element. At least the MR data identified from the exclusion information are excluded from the reconstruction of the image dataset.

11 Claims, 2 Drawing Sheets

(56) References Cited

U.S. PATENT DOCUMENTS

| | | | | |
|---|---|---|---|---|
| 8,575,933 | B2* | 11/2013 | Hu | G01R 33/3415 |
| | | | | 324/309 |
| 8,823,372 | B2* | 9/2014 | Weber | G01R 33/4833 |
| | | | | 324/309 |
| 9,572,514 | B2* | 2/2017 | Wang | G01R 33/4824 |
| 9,612,300 | B2* | 4/2017 | Sharma | G01R 33/4828 |
| 9,655,522 | B2* | 5/2017 | Li | G06K 9/52 |
| 9,759,786 | B2* | 9/2017 | Asaba | G01R 33/3415 |
| 10,401,459 | B2* | 9/2019 | Koktzoglou | G01R 33/56527 |
| 2015/0145514 | A1* | 5/2015 | Sharma | G01R 33/243 |
| | | | | 324/309 |
| 2017/0097402 | A1* | 4/2017 | Koktzoglou | G01R 33/4828 |
| 2019/0154782 | A1* | 5/2019 | Kartaeusch | G01R 33/56563 |

OTHER PUBLICATIONS

European Search Report dated Apr. 3, 2020 for Application No. 10 2017 220 699.3.

Xue, et. al,: "Automatic Coil Selection for Streak Artifact Reduction in Radial MRI", Magnetic Resonance in Medicine, vol. 67, pp. 470-476 (2012).

Yanasak, E. et al: "MR Imaging Artifacts and Parallel Imaging Techniques with Calibration Scanning: A New Twist on Old Problems"; RadioGraphics; vol. 34; No. 2; pp. 532-549; (2014).

\* cited by examiner

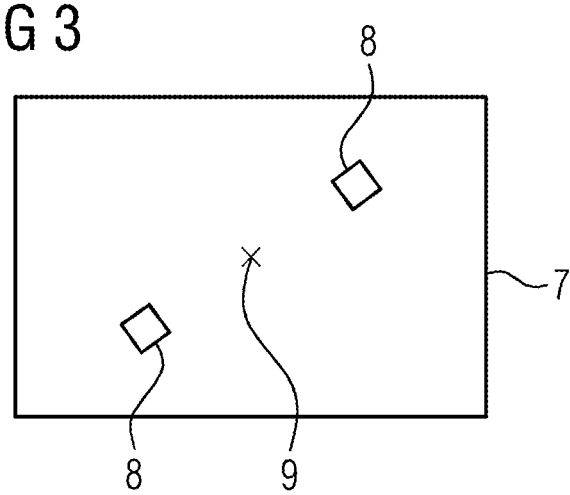
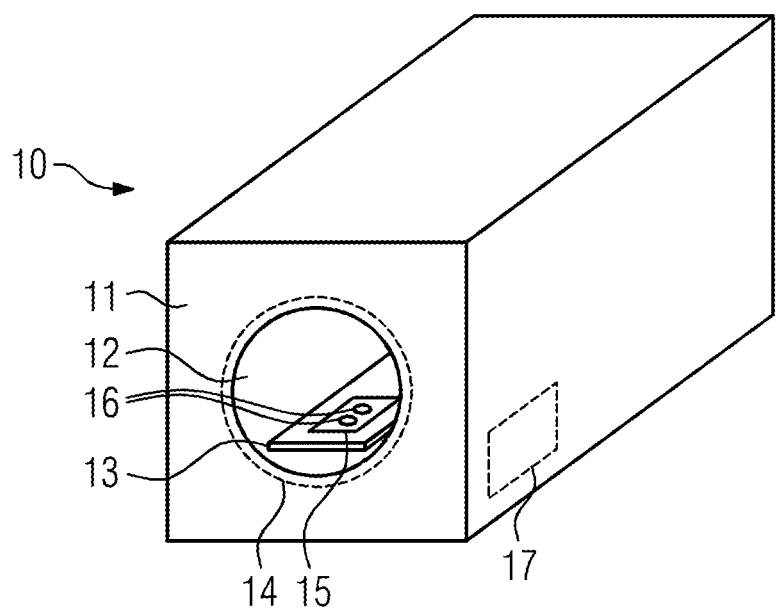

METHOD AND APPARATUS FOR REDUCING ARTIFACTS IN A MAGNETIC RESONANCE IMAGE DATASET

BACKGROUND OF THE INVENTION

Field of the Invention

The invention concerns a method for reducing artifacts in an image dataset reconstructed from magnetic resonance data that were acquired by radial sampling using different reception coil elements, as well as a magnetic resonance apparatus and an electronically readable data storage medium that implements such a method.

Description of the Prior Art

Magnetic resonance (MR) imaging is an established and important tool in medical diagnostics. In order to produce a magnetic resonance image, raw magnetic resonance data are acquired from a subject situated in an MR data acquisition scanner, and the raw data are entered into a memory organized as k-space, at respective data points in the memory. The k-space data are converted, such as by a Fourier transformation, into image data. The entry or filling of data into k-space at the respective data points in k-space is called sampling k-space. In Cartesian sampling of k-space, the data are entered in respective lines of k-space in a Cartesian grid. In radial scanning, the data are entered along paths that proceed from the center of k-space toward the periphery of k-space.

Although conventional techniques used Cartesian sampling of k-space, radial sampling of k-space is gaining in importance because far less data are acquired than for Cartesian sampling, thereby allowing a significant reduction in scan times. Magnetic resonance measurements (data acquisitions) using radial sampling also exhibit high robustness to movement in the field of view. In particular, radial sampling is frequently combined with the local acquisition of the magnetic resonance data using a local reception coil composed of multiple coil elements (and hence using multiple reception channels). Suitably designed reconstruction algorithms for parallel imaging make it possible to generate a combined MR image dataset from the raw magnetic resonance data from the individual coil elements, and hence from individual reception channels that provide a good-quality representation of the field of view.

A problem with radial sampling is the increase in certain artifacts, in particular artifacts known as streaking artifacts. Although streaking can arise as a result of undersampling (i.e., not making a data entry at every possible data entry point in k-space), where the Nyquist criterion is violated in the outer regions of k-space, another cause of streaking artifacts has been identified as being inhomogeneities in the basic magnetic field and linearity errors in the gradient fields. The cause of such streaking artifacts is in high variations in intensity, which mainly arise in the edge region of the field of view, although the streaking artifacts can also extend over larger regions in the image dataset. Undersampling of k-space, a practice which is often employed, heightens this effect. These artifacts can affect the image quality of the image dataset to such an extent that diagnostic relevance is lost.

Therefore approaches aimed at reducing the artifacts in image datasets have been proposed. For example, it has been proposed to use iterative reconstruction approaches, for instance in the context of compressed sensing, but a sufficient reduction in the artifacts has not been achieved in these approaches. Oversampling has also been proposed in order to reduce artifacts, although a longer measurement time, in particular for dynamic measurements using contrast agent, does not appear feasible in terms of either diagnostic aspects or efficiency and patient comfort.

An article by Yiqun Xue et al., "Automatic Coil Selection for Streak Artifact Reduction in Radial MRI", Magnetic Resonance in Medicine 67:470-476(2012) proposed a post-processing method for automatically identifying those coil elements whose magnetic resonance data are responsible for the artifacts. Specifically, this article proposes reconstructing coil images for the individual coil elements in order then to apply a low-pass Hanning filter to suppress high-frequency components. Streaks are also drastically reduced in this process, allowing the streaking artifact level to be quantified from the mean image intensity difference. The solution proposed in this article therefore concerns a computationally intensive, complex approach, which, in particular for images depicting inherently streak-like structures, can easily result in assessment mistakes.

SUMMARY OF THE INVENTION

An object of the present invention is to reduce streaking artifacts in parallel imaging using multiple reception coil elements in a manner improved over the prior art and is reliable and based on physical facts.

In the method according to the invention of the general type mentioned above, at least some of the coil elements, exclusion information is determined in a computer, the exclusion information identifying magnetic resonance data from a coil element under consideration that are responsible for at least one artifact. The computer identifies the exclusion information by a comparison of a sensitivity map, which defines the spatial reception capability (pattern) of the coil element under consideration, with at least one comparison dataset obtained from at least a portion of the magnetic resonance data from the coil element under consideration. At least the magnetic resonance data identified from this exclusion information are excluded from the reconstruction of the image dataset. The image dataset reconstruct in the computer is made available from the computer in electronic form, as a datafile.

The exclusion information is preferably determined such that ultimately an appropriate comparison is performed for all the coil elements and all the magnetic resonance data. It is also conceivable, however, to select the magnetic resonance data to be checked to be only data that originate from coil elements lying at the edge of the field of view, since it has been found in practice that it is here where the main source of streaking artifacts lies, because this is the region where non-linearities in the gradient fields, if they exist, are most prominent.

Therefore according to the invention, individual coil elements, magnetic resonance data responsible for artifacts are identified by checking whether the individual coil element was actually capable of receiving magnetic resonance signals from a region in image domain containing corresponding image information. The corresponding reception profiles, which define from where a coil element can receive magnetic resonance signals, usually exist anyway in the form of sensitivity maps for of all these individual coil elements if a parallel imaging technique employing radial imaging is being used. The present invention makes use of the known fact that the sensitivity map is determined by combined evaluation of magnetic resonance data from the particular coil element and magnetic resonance data from a body coil, and that the sensitivity maps are used in the reconstruction of the image dataset. For instance, parallel imaging procedures are known in which, in order to determine the sensitivity maps for the individual coil elements, the magnetic resonance data from these coil elements are compared with magnetic resonance data from a pre-scan (which takes place before the actual diagnostic scan), which have usually been acquired in the pre-scan using the body coil of the magnetic resonance apparatus. Other magnetic resonance protocols provide dedicated reference scans to determine a sensitivity map that is required for mutual normalization of the measurements from the individual coil elements. The present invention can be used particularly advantageously with imaging techniques such as SENSE, GRASP (Golden-Angle Radial Sparse Parallel) and BLADE. The advantage here is that a sensitivity map that is determined anyway for each coil element can also be used for reducing streaking artifacts.

The sensitivity maps of the individual coil elements therefore provide a spatially resolved representation of those spatial regions in which the coil element can receive magnetic resonance signals. The basis of the invention is to use this information in order to detect artifacts in the magnetic resonance data, since all the image content in the magnetic resonance data lying outside the sensitivity region cannot have been obtained physically and hence can be attributed to an artifact. Thus by determining which structures obtained from the magnetic resonance data lie inside the sensitivity regions of the coil element and which lie outside, artifacts, or rather magnetic resonance data causing these artifacts, can be detected particularly easily by the aforementioned comparison, and ideally excluded from the reconstruction of the image dataset.

In a preferred embodiment of the invention, a comparison mask is determined from the sensitivity map, using at least one threshold value for the sensitivity, and structures of the comparison dataset that lie outside the comparison mask and hence outside the sensitivity region of the coil element under consideration are identified as artifact structures using this mask. Thus, the comparison mask defines those sensitivity regions in which information in the magnetic resonance data can physically exist, and where such information cannot exist. Whatever lies outside the sensitivity regions in the image domain cannot be detected in a physically correct manner and therefore constitutes an error that indicates an artifact source. In this context, structures are image content that differs significantly from pure noise effects and that can be identified by suitable relevance criteria, which can be parameterized, for instance, using at least one threshold value. Thus ostensible image information in a spatial region in which the coil cannot receive can be deemed to be artifacts or the basis for an artifact. Based on an identification of this type, there are various specific ways of implementing the method according to the invention.

In a first, simple embodiment, a comparison dataset is reconstructed from all the magnetic resonance data from the coil element under consideration and, for determining artifact structures, all of this magnetic resonance data are analyzed in order to obtain the exclusion information. In this embodiment, a comparison dataset is reconstructed from all of the magnetic resonance data from each coil element to be examined in this manner, i.e. from its corresponding reception channel, and are checked. If it is ascertained that the coil element has produced information for which there is no physical explanation, which information is thus likely to be the basis of an artifact or represents an artifact, all of the magnetic resonance data from the coil element are discarded, and the image dataset is reconstructed from the magnetic resonance data from the remaining coil elements. This embodiment is particularly advantageous when a local coil having a large number of channels, i.e. a large number of reception coil elements, is used, because excluded coil elements then have less consequence. It is typical in such an embodiment that magnetic resonance data from coil elements in the outer region of the field of view will be excluded from the reconstruction. Another way of describing this embodiment is that the signal from the image domain, which signal is reconstructed one channel at a time, is compared with the per-channel reception profiles.

In a second, preferred embodiment of the present invention, the at least one comparison dataset is reconstructed only from a portion of the magnetic resonance data from the coil element under consideration, wherein in determining artifact structures, only this portion of the magnetic resonance data is identified in the exclusion information. In this case, by smaller samples of the magnetic resonance data, magnetic resonance data are chosen that, while not providing any useful image upon being reconstructed, also should not generate any misinformation outside the sensitivity region for an artifact-free acquisition, in order to identify more precisely magnetic resonance data responsible for artifacts. It is thereby possible to differentiate within the individual reception channels, and more data are available for reconstructing the image dataset. This is advantageous when removing the magnetic resonance data obtained from entire coil elements would be detrimental, especially in edge regions of the field of view, because coverage there is equally necessary for a complete diagnostic picture, for instance in magnetic resonance imaging of the liver or the like.

It is advantageous for individual spokes of the radial sampling to be used as the aforementioned portion. While it is not possible to obtain, from reconstructing a single radially sampled spoke in k-space, a result that can be used meaningfully for diagnosis, this embodiment of the invention is based on the insight that in an artifact-free acquisition, the reconstruction of the comparison dataset does not produce any image information outside the sensitivity region, which means that errors, i.e. artifacts, can also be identified for individual spokes, and consequently other spokes that do not exhibit these errors can remain in the reconstruction.

In a third preferred possible embodiment of the present invention, an exclusion mask is determined by transforming the artifact structures back into k-space, with magnetic resonance data covered by the exclusion mask being identified in the exclusion information. Hence erroneous image information is thereby identified from the known sensitivity region of the particular coil element, physical components of the comparison dataset are removed, and only the artifact structures are converted back into k-space by a suitable Fourier transform. This produces a mask that indicates from which parts of k-space the corresponding erroneous image content, i.e. artifact structures, originates. When this exclusion mask is now placed over k-space, the magnetic resonance data producing the artifact structures can be excluded reliably, and the magnetic resonance data that are not contributing to these artifact structures can be retained. It is thereby possible to retain a far greater proportion of the magnetic resonance data from an artifact-affected coil element/reception channel, and to maintain a high quality of the resultant image dataset.

It should be noted also in this third possible embodiment, it is still possible for the mask to result in the portions of the magnetic resonance data from a coil element that are used for reconstructing the comparison dataset to be individual spokes or groups of spokes.

In a further embodiment for the purpose of plausibility checking, a verification dataset is reconstructed from the magnetic resonance data forming the basis of the comparison dataset and excluding the identified magnetic resonance data, and this verification dataset is compared with the sensitivity map. Plausibility exists when the artifact structures can now no longer be detected or at least are significantly reduced.

In acquisitions that are severely affected by artifacts, it may arise in the present invention that too much magnetic resonance data have to be removed in the reconstruction of the image dataset in order to ensure a predetermined quality, or rather a quality necessary for diagnosis. In this context, in another embodiment of the present invention, the exclusion information contains additional information relating to the artifact severity and/or level of contribution to an artifact. When a quality criterion is fulfilled by evaluation of the additional information, which quality criterion indicates a quality of the image dataset that is too low as a result of excluding identified magnetic resonance data, some of the identified magnetic resonance data are introduced into the reconstruction of the image dataset. Hence some of the identified magnetic resonance data can nonetheless be "re-approved" when more magnetic resonance data are needed for the meaningful reconstruction of an image dataset. The re-approved data are preferably magnetic resonance data that least compromises the image quality through artifacts. This concerns magnetic resonance data that are associated with an artifact of low artifact severity, for instance wherein the artifact structures have a low intensity. Likewise, magnetic resonance data can still be re-approved if the data have sufficiently low level of contribution to the artifact structures, for instance being at the edge of the selection mask, and the like. The quality criterion can be based, for example, on a first reconstruction of the image dataset without the identified magnetic resonance data, as is generally known in the prior art, in particular also in relation to the examination objective. In particular, an iterative improvement to the image dataset is conceivable in further steps by approving additional magnetic resonance data. It should be mentioned that a similar effect can also be achieved when parameter settings are adjusted as part of the identification process, for instance threshold values relating to the comparison mask and/or to the classification as artifact structures, and the like.

The present invention also encompasses a magnetic resonance apparatus, which has a control computer designed to perform the method according to the invention. All the statements relating to the method according to the invention can be applied analogously to the magnetic resonance apparatus according to the invention, and therefore the aforementioned advantages can likewise be achieved by the apparatus. The control computer contains, in addition to a sensitivity determination processor for determining sensitivity maps for coil elements being used, and/or a sequence controller for controlling the acquisition of magnetic resonance data, also a reconstruction processor for reconstructing datasets from magnetic resonance data, a comparator for determining the exclusion information, and an exclusion processor for excluding identified magnetic resonance data from the data used by the reconstruction processor to reconstruct the image dataset.

The present invention also encompasses a non-transitory, computer-readable data storage medium encoded with programming instructions that, when the storage medium is loaded into a control computer of an magnetic resonance apparatus, cause the control computer to operate the magnetic resonance apparatus so as to implement any or all embodiments of the method according to the invention, as described above.

The data storage medium can be a CD-ROM.

BRIEF DESCRIPTION OF THE DRAWINGS

FIG. 3 shows a resultant selection mask in k-space.

FIG. 4 shows a magnetic resonance apparatus according to the invention.

DESCRIPTION OF THE PREFERRED EMBODIMENTS

Figure 1:
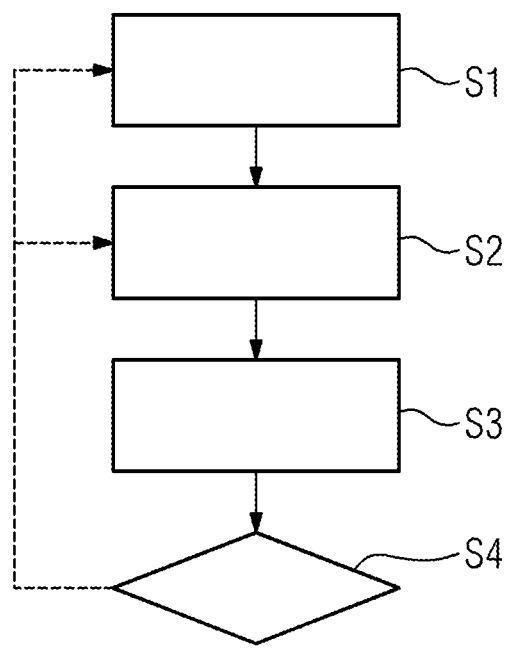
FIG. 1 is a flowchart of an exemplary embodiment of the method according to the invention.

FIG. 1 is a basic flowchart relating to exemplary embodiments of the method according to the invention. It is assumed here that in a previous step, which is not shown, magnetic resonance data from parallel imaging using a local coil composed of multiple coil elements, i.e. multiple reception channels, has been acquired by radial sampling of k-space. For example, a GRASP sequence can have been used overall in this process. In particular magnetic resonance data from a body coil are also available here, which data are used, as is generally known, to determine sensitivity maps for each coil element, which can be included in a later step in the reconstruction of an image dataset.

Before reconstructing an image dataset or when it has been ascertained that the reconstructed image dataset contains too many artifacts, in particular streaking artifacts, magnetic resonance data potentially responsible for at least one artifact are identified in a step S1, in which process a check is performed for each coil element in the present case. Step S1 produces exclusion information, which identifies magnetic resonance data that might be responsible for at least one artifact. This exclusion information for the magnetic resonance data and the various coil elements is used in a step S2 to reduce the amount of magnetic resonance data from which ultimately the image dataset is meant to be reconstructed, this being achieved by excluding from the reconstruction, identified magnetic resonance data.

Then in a step S3, the artifact-reduced image dataset is reconstructed using generally known reconstruction algorithms. In particular these use the sensitivity maps for normalization.

In an optional step S4, a check can be performed to ascertain whether the image dataset have sufficient quality or whether too much magnetic resonance data has been identified/removed. In the latter case, a repetition can accordingly be performed, in either step S1 or S2. In step S1, criteria leading to identification are weakened. In step S2, by assessing information relating to the artifact severity and/or level of contribution to an artifact, which information is added to the exclusion information, additional magnetic resonance data are approved for the reconstruction, in particular data associated with weak artifacts and/or making only a weak contribution.

In the context of the present invention, step S1 can be implemented specifically in various ways. While it is fundamentally conceivable to use always the entire magnetic resonance data from a coil element to reconstruct a comparison dataset, which is then compared with the sensitivity regions defined by the sensitivity map in order to identify artifact structures, according to a preferred variant, although all the magnetic resonance data from a coil element are used to determine comparison datasets, only portions are used for one comparison dataset. These portions are preferably a spoke of the radial sampling in each case.

Figure 2:
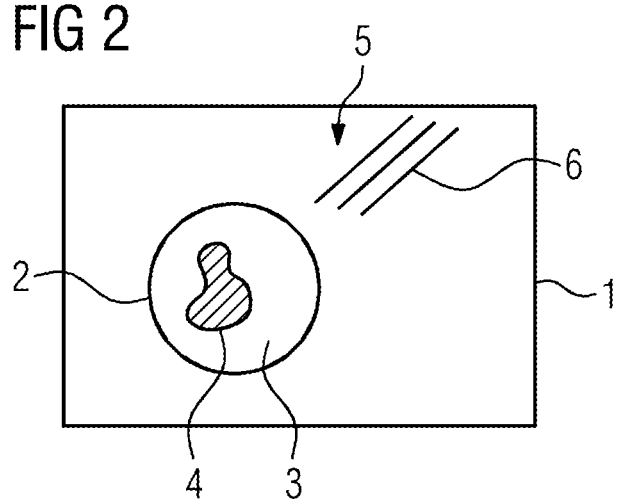
FIG. 2 schematically shows how artifact structures are identified according to the invention.

FIG. 2 shows schematically such a comparison dataset 1. FIG. 2 also shows a comparison mask 2, which bounds the sensitivity region of the coil element in image space, in which the comparison dataset 1 also exists of course. The sensitivity regions and hence the comparison mask 2 may be defined, for example, by means of an appropriate threshold value for the sensitivity.

Image information 4 that lies inside the coil-element sensitivity region 3 defined by the comparison mask 2 can obviously have been acquired in a manner that is physically correct. The same cannot be said, however, for image information 5 that is outside the sensitivity region 3, for which information it is physically impossible that it has been acquired using the coil element, and therefore this involves an error and the image information 5 can be identified as artifact structures 6. It should also be mentioned here that in order to identify structures lying outside the sensitivity region 3, i.e. image information 5, as such, at least one relevance criterion can be used for the purpose of distinguishing from noise effects, which criterion can be parameterized by means of a threshold value, for example (and can be adjusted accordingly, for instance in repeating step S1, as described in FIG. 1 with the implementation of step S4).

In the first embodiment, all the magnetic resonance data forming the basis of the reconstruction of the comparison dataset 1 can be identified in the exclusion information as affected by artifacts on artifact structures 6 being identified. According to a second embodiment, the magnetic resonance data responsible for the artifact structures 6, and which forms the basis for the comparison dataset 1, are identified more precisely, and only this data is excluded. For this purpose, the artifact structures 6 (and only these) are transformed by Fourier transform back into k-space 7 (see FIG. 3), and define there, based on their position, an exclusion mask 8, which is symmetrical about the center 9 of k-space and indicates at least that magnetic resonance data that are responsible for the artifact structures 6. In this case, only the magnetic resonance data identified by the exclusion mask 8 are identified in the exclusion information as contributing to at least one artifact.

The smallest possible amount of magnetic resonance data thereby has to be excluded, in particular if in addition only portions, for instance spokes, of the magnetic resonance data form the basis of the comparison dataset.

This produces no additional computational effort because the sensitivity maps are needed anyway and are therefore available in the imaging technology.

It should be noted that in the second embodiment described with reference to FIG. 3, in which an exclusion mask 8 is defined, the remaining magnetic resonance data can be used to perform a new reconstruction, in this case a verification dataset, in order to check the plausibility of the removal and to verify whether now actually there are no longer any artifact structures 6 present or these structures have been at least significantly reduced.

FIG. 4 is a schematic illustration of a magnetic resonance apparatus 10 according to the invention, which, as is generally known, has an MR data acquisition scanner 11, having a superconducting basic field magnet, which defines a cylindrical patient placement area 12 into which a patient table 13 can be moved. The patient placement area 12 is surrounded by a body coil 14 and a gradient coil arrangement (not shown). A local coil 15 has multiple coil elements 16 (which are merely suggested here) and is provided on the patient table 13 so as to acquire the magnetic resonance data.

The operation of the magnetic resonance apparatus 10 is controlled by a control computer 17, which is also designed to implement the method according to the invention. For this purpose, the control computer 17 has, in addition to a sensitivity-map determination processor and a sequence controller for controlling the magnetic resonance data acquisition, a reconstruction processor for reconstructing the comparison datasets, and if applicable the verification dataset, and the image dataset, and a comparator for determining the exclusion information, and an exclusion processor for excluding identified magnetic resonance data.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for reducing artifacts in a magnetic resonance (MR) image dataset, comprising:

operating an MR data acquisition scanner to acquire MR signals from a subject using a plurality of different reception coil elements, each having a respective reception sensitivity, and entering the acquired MR signals into a memory as k-space data, by radial sampling;

for each of at least some of the reception coil elements, providing a computer with a sensitivity map that defines a spatial reception capability of the respective coil element corresponding to the reception sensitivity of the respective coil element;

for each of said at least some of said reception coil elements, comparing, in said computer, the sensitivity map for the respective coil element with at least one comparison dataset obtained from at least a part of the MR signals received by the respective coil element to provide exclusion information that identifies one or more MR signals to be excluded;

in said computer, determining a comparison mask from the respective sensitivity map using at least one threshold value for sensitivity, so that structures of said comparison dataset that are outside of said comparison mask, and thus outside of a sensitivity region of the respective reception coil element, are identified as artifact structures;

in said computer, excluding, based on the exclusion information, at least some of the MR signals received by the respective reception coil element, or the k-space data corresponding thereto, as being likely to produce an artifact in an image reconstructed from said k-space data; and in said computer, reconstructing said image from said k-space data while excluding, from said reconstructing, the excluded at least some MR signals, and making the reconstructed image available from the computer in electronic form, as a datafile.

2. A method as claimed in claim 1 comprising determining said sensitivity map in said computer by a combined evaluation of the MR signals from the respective reception coil element, and MR signals acquired with a body coil of the MR scanner.

3. A method as claimed in claim 1 comprising also using the respective sensitivity maps for the respective reception coil elements in reconstructing said image dataset.

4. A method as claimed in claim 1 comprising reconstructing said comparison dataset for a respective reception coil element from all of the MR signals received by the respective reception coil element, and, if artifacts are identified, analyzing an entirety of the comparison dataset to provide the exclusion information.

5. A method as claimed in claim 1 comprising reconstructing the comparison dataset for a respective reception coil element only from a portion of the MR signals received by the respective reception coil element, and, if artifacts are identified, reviewing only said portion to identify said artifact structures.

6. A method as claimed in claim 4 comprising using respective single spokes of said radial sampling as said portion.

7. A method as claimed in claim 1, comprising, in said computer, generating an exclusion mask by transforming the artifact structures back into k-space and determining said exclusion information as being k-space data covered by said exclusion mask.

8. A method as claimed in claim 6 comprising, in said computer, implementing a plausibility check by reconstructing a verification dataset from the MR signals used to generate said comparison dataset, and which excludes the MR signals identified by said exclusion information, and comparing said verification dataset with said sensitivity map for the respective reception coil element.

9. A method as claimed in claim 1 comprising generating said exclusion information in said computer so as to contain additional information describing at least one of an artifact severity and a level of contribution of MR signals to an artifact, and applying a quality criterion to said additional information, said quality criterion specifying a quality of the image dataset that is too low as a result of excluding the identified MR signals, and, when said quality criterion is fulfilled, reintroducing at least some of the excluded MR signals into the reconstruction of said image dataset that are likely to represent a non-severe artifact.

10. A magnetic resonance (MR) apparatus comprising:
an MR data acquisition scanner comprising a plurality of different reception coil elements, each reception coil element having a reception sensitivity associated therewith; and
a computer configured to:
operate said MR data acquisition scanner to acquire MR signals from a subject using said plurality of different reception coil elements, and entering the acquired MR signals into a memory as k-space data, by radial sampling;
for each of at least some of the reception coil elements, receive a sensitivity map that defines a spatial reception capability of the respective coil element corresponding to the reception sensitivity of the respective coil element;
for each of said at least some of said reception coil elements, compare the sensitivity map for the respective coil element with at least one comparison dataset obtained from at least a part of the MR signals received by the respective coil element to provide exclusion information that identifies one or more MR signals to be excluded;
determine a comparison mask from the respective sensitivity map using at least one threshold value for sensitivity, so that structures of said comparison dataset that are outside of said comparison mask, and thus outside of a sensitivity region of the respective reception coil element, are identified as artifact structures;
exclude, based on said exclusion information, at least some of the MR signals received by the respective reception coil element, or the k-space data corresponding thereto, as being likely to produce an artifact in an image reconstructed from said k-space data; and
reconstruct said image from said k-space data while excluding, from said reconstructing, the excluded at least some MR signals, to and make the reconstructed image available from the computer in electronic form, as a datafile.

11. A non-transitory, computer-readable data storage medium encoded with programming instructions, said storage medium being loaded into a control computer of a magnetic resonance (MR) apparatus comprising an MR data acquisition scanner having a plurality of different reception coil elements, each having a respective reception sensitivity, said programming instructions causing said control computer to:
operate said MR data acquisition scanner to acquire MR signals from a subject using said plurality of different reception coil elements, and enter the acquired MR signals into a memory as k-space data, by radial sampling;
for each of at least some of the reception coil elements, receive a sensitivity map that defines a spatial reception capability of the respective coil element corresponding to the reception sensitivity of the respective coil element;
for each of said at least some of said reception coil elements, compare the sensitivity map for the respective coil element with at least one comparison dataset obtained from at least a part of the MR signals received by the respective coil element to provide exclusion information that identifies one or more MR signals to be excluded;
determine a comparison mask from the respective sensitivity map using at least one threshold value for sensitivity, so that structures of said comparison dataset that are outside of said comparison mask, and thus outside of a sensitivity region of the respective reception coil element, are identified as artifact structures;
exclude, based on said exclusion information, at least some of the MR signals received by the respective reception coil element, or the k-space data corresponding thereto, as being likely to produce an artifact in an image reconstructed from said k-space data; and
reconstruct said image from said k-space data while excluding, from said reconstructing, the excluded at least some MR signals, and make the reconstructed image available from the control computer in electronic form, as a datafile.

* * * * *